(12) United States Patent
Hiraoka et al.

(10) Patent No.: US 9,112,187 B2
(45) Date of Patent: Aug. 18, 2015

(54) ORGANIC EL DEVICE AND METHOD OF MANUFACTURING ORGANIC EL DEVICE

(75) Inventors: Tomomi Hiraoka, Hyogo (JP); Yasuo Segawa, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/005,866

(22) PCT Filed: Jun. 8, 2011

(86) PCT No.: PCT/JP2011/003240
§ 371 (c)(1),
(2), (4) Date: Sep. 18, 2013

(87) PCT Pub. No.: WO2012/168973
PCT Pub. Date: Dec. 13, 2012

(65) Prior Publication Data
US 2014/0008627 A1    Jan. 9, 2014

(51) Int. Cl.
*H01L 51/56* (2006.01)
*H01L 51/52* (2006.01)

(52) U.S. Cl.
CPC ............... *H01L 51/56* (2013.01); *H01L 51/52* (2013.01); *H01L 2251/568* (2013.01)

(58) Field of Classification Search
USPC ............................................... 257/40; 438/4
See application file for complete search history.

(56) References Cited

U.S. PATENT DOCUMENTS

| 6,747,728 | B2* | 6/2004 | Nagayama | 349/192 |
|---|---|---|---|---|
| 7,258,586 | B2 | 8/2007 | Tamura et al. | |
| 7,507,590 | B2 | 3/2009 | Konda | |
| 7,531,101 | B2 | 5/2009 | Beteille | |
| 7,701,133 | B2* | 4/2010 | Kajiyama et al. | 313/504 |
| 7,964,416 | B2* | 6/2011 | Miyazawa | 438/4 |
| 8,518,719 | B2 | 8/2013 | Hiraoka et al. | |
| 2005/0215163 | A1* | 9/2005 | Tamura et al. | 445/24 |
| 2006/0178072 | A1* | 8/2006 | Konda | 445/3 |

(Continued)

FOREIGN PATENT DOCUMENTS

| JP | 2004-281328 | 10/2004 |
|---|---|---|
| JP | 2005-276600 | 10/2005 |

(Continued)

OTHER PUBLICATIONS

International Search Report and Written Opinion for PCT/JP2011/003240, mail date is Aug. 2, 2011, along with an English translation of ISR.

(Continued)

*Primary Examiner* — Matthew W Such
*Assistant Examiner* — David Spalla
(74) *Attorney, Agent, or Firm* — Greenblum & Bernstein, P.L.C.

(57) ABSTRACT

A method of manufacturing an organic EL device includes: irradiating a light-emitting region of the organic EL device which includes a defective portion with a laser beam under a first irradiation condition; observing a state of an irradiation mark formed in the light-emitting region through the irradiation with the laser beam in the irradiating under a first irradiation condition; determining a second irradiation condition for resolving a defect caused by the defective portion, based on the first irradiation condition and the observed state of the irradiation mark; and irradiating the light-emitting region with a laser beam under the second irradiation condition determined in the determining of a second irradiation condition.

7 Claims, 10 Drawing Sheets

(56) References Cited

U.S. PATENT DOCUMENTS

| | | |
|---|---|---|
| 2007/0141360 A1 | 6/2007 | Beteille |
| 2009/0189151 A1* | 7/2009 | Borner et al. ............. 257/40 |
| 2010/0062550 A1* | 3/2010 | Buchel et al. ............. 438/17 |
| 2011/0278603 A1* | 11/2011 | Miyazawa et al. ......... 257/88 |
| 2013/0248844 A1 | 9/2013 | Hiraoka |
| 2013/0320323 A1 | 12/2013 | Segawa et al. |

FOREIGN PATENT DOCUMENTS

| | | |
|---|---|---|
| JP | 2006-502545 | 1/2006 |
| JP | 2006-221982 | 8/2006 |
| JP | 2009-016195 | 1/2009 |
| JP | 2009-140627 | 6/2009 |
| JP | 2009-277528 | 11/2009 |
| JP | 2011-077124 | 4/2011 |
| WO | WO 2012165640 A1 * | 12/2012 |

OTHER PUBLICATIONS

International Preliminary Report on Patentability, dated Dec. 11, 2012.

U.S. Appl. No. 14/005,687 to Tomomi Hiraoka et al., which was filed on Sep. 17, 2013.

* cited by examiner

ORGANIC EL DEVICE AND METHOD OF MANUFACTURING ORGANIC EL DEVICE

TECHNICAL FIELD

The present invention relates to an organic EL device and a method of manufacturing an organic electroluminescence device.

BACKGROUND ART

Conventionally, in an organic electroluminescence (hereinafter referred to as organic EL) device including an organic layer interposed between an anode and a cathode, there are cases where an undesirable short circuit occurs due to attachment or mixture of a conductive foreign substance or patterning defects during the manufacturing process, and the organic EL device becomes defective.

In this case, there is a method of repairing a defect caused by the short circuit, by increasing resistance by irradiating a target region defined by the shorted area or the periphery thereof with a laser (see, for example, Patent Literature 1 to 3).

Patent Literature 1 discloses a technique of measuring the depth of an electrode forming film that is removed by laser irradiation, midway through the laser irradiation process, recognizing the progress of correction at that time from the relationship between the measured depth and a previously known thickness of the electrode forming film before the correction, and adjusting the laser irradiation after the measurement.

Patent Literature 2 discloses a method of measuring the size of a foreign substance which is located between a cathode and an anode and contributes to the short circuiting of the cathode and the anode, setting the wavelength and number of irradiations of a laser with which the foreign substance is to be irradiated, based on the size of the foreign substance, and irradiating the foreign substance with the set laser, to thereby remove at least part of the foreign substance.

Patent Literature 3 discloses a method of detecting a potential defective area of an organic EL device by way of fluorescent testing using irradiation with a first ultraviolet laser, and irradiating the detected defective area with a second ultraviolet laser for repairing to thereby remove the defective area.

CITATION LIST

Patent Literature

[PTL 1] Japanese Unexamined Patent Application Publication No. 2004-281328
[PTL 2] Japanese Unexamined Patent Application Publication No. 2006-221982
[PTL 3] Japanese Unexamined Patent Application Publication No. 2009-277528

SUMMARY OF INVENTION

Technical Problem

When repairing a defect caused by a short circuit by using laser irradiation, it is important to minimize damage to areas other than the target region, and to reliably and efficiently increase the resistance in the target region. As such, the laser irradiation condition needs to be controlled adaptively and rapidly. In addition, it is preferable that such control be convenient.

However, in light of such a demand, it is considered that the methods provided by the prior art have room for improvement.

In the method in Patent Literature 1, it is described that the removed depth of the electrode forming film removed by laser irradiation (irradiation mark) is measured using, for example, a probe-based surface roughness measuring instrument, a laser measurement-based displacement meter, an ion detector which detects substance scattered through laser irradiation, and so on, and thus measuring the depth of the laser irradiation mark requires complex measuring devices.

The method in Patent Literature 2 requires advanced performance of research in which foreign substances of different sizes are actually irradiated with a laser to repair the dark-spot pixel, in order to identify the wavelength and number of irradiations of the laser that is suitable for the size of the foreign substance, and is thus lacking in convenience and adaptability to different lots and types.

The method in Patent Literature 3 focuses on appropriately reducing the range of fluorescent testing in order to minimize the deterioration of the light-emitting capability of an organic EL device caused by the testing ultraviolet laser and shorten testing time, and thus fails to indicate how to control the irradiation conditions for the ultraviolet laser for repairing.

In view of the aforementioned problem, the present invention has as an object to provide (i) a method of manufacturing an organic EL device capable of adaptively, rapidly, and conveniently controlling the irradiation condition of a laser for repairing a defect caused by a short circuit of an organic EL device, and (ii) an organic EL device manufactured using such a manufacturing method.

Solution to Problem

In order to solve the aforementioned problem, a method of manufacturing an organic electroluminescence (EL) device according to an aspect of the present invention includes: irradiating a light-emitting region of the organic EL device with a laser beam under a first irradiation condition, the light-emitting region including a defective portion; observing a state of an irradiation mark formed in the light-emitting region through the irradiation with the laser beam in the irradiating under a first irradiation condition; determining a second irradiation condition for resolving a defect caused by the defective portion, based on the first irradiation condition and the observed state of the irradiation mark; and irradiating the light-emitting region with a laser beam under the second irradiation condition determined in the determining of a second irradiation condition, wherein the defective portion is a shorted area between an anode and a cathode of the organic EL device, in the irradiating under the second irradiation condition, the laser beam is emitted in a form of a closed line surrounding the shorted area of the light-emitting region so that a resistance value of a portion located on the closed line form is higher than a resistance value of the portion before the irradiation with the laser beam, and in the irradiating under a first irradiation condition, the laser beam is emitted to an inside of a region that is to be surrounded by the closed line.

Advantageous Effects of Invention

According to the method of manufacturing an organic EL device according to the present invention, preliminary irradiation (primary laser irradiation) for determining the condition for laser irradiation (secondary laser irradiation) at the time of repairing is performed on the inside of a light-emitting region of a defective pixel, and thus there is no concern that characteristics of the laser irradiation targets are different as in the case where, for example, the preliminary irradiation is performed on the outside of the light-emitting region, and the condition for the laser irradiation at the time of repairing can be accurately determined, and thus repair can be performed more reliably and stably.

DESCRIPTION OF EMBODIMENTS

A method of manufacturing an organic electroluminescence (EL) device according to an aspect of the present invention includes: irradiating a light-emitting region of the organic EL device with a laser beam under a first irradiation condition, the light-emitting region including a defective portion; observing a state of an irradiation mark formed in the light-emitting region through the irradiation with the laser beam in the irradiating under a first irradiation condition; determining a second irradiation condition for resolving a defect caused by the defective portion, based on the first irradiation condition and the observed state of the irradiation mark; and irradiating the light-emitting region with a laser beam under the second irradiation condition determined in the determining of a second irradiation condition.

Here, in the determining of a second irradiation condition, at least one of a focal point depth, pulse width, wavelength, and power of the laser beam may be determined as the second irradiation condition.

According to such a manufacturing method, preliminary irradiation (primary laser irradiation) for determining the condition for laser irradiation (secondary laser irradiation) at the time of repairing is performed on the inside of a light-emitting region of a defective pixel, and thus there is no concern that characteristics of the laser irradiation targets are different as in the case where, for example, the preliminary irradiation is performed on the outside of the light-emitting region, and the condition for the laser irradiation at the time of repairing can be accurately determined, and thus repair can be performed more reliably and stably.

Furthermore, the defective portion may be a shorted area between an anode and a cathode of the organic EL device.

Furthermore, in the irradiating under the second irradiation condition, the laser beam may be emitted in a form of a closed line surrounding the shorted area of the light-emitting region so that a resistance value of a portion located on the closed line form is higher than a resistance value of the portion before the irradiation with the laser beam.

According to such a manufacturing method, when the defective portion is a shorted area between the anode and the cathode of the organic EL device, electrically separating the shorted area from the light-emitting region using the irradiation mark formed by the laser irradiation at the time of repairing allows the light-emitting capability of the light-emitting region to recover.

Furthermore, in the irradiating under a first irradiation condition, the laser beam may be emitted to an inside of a region that is to be surrounded by the closed line.

According to such a manufacturing method, the preliminary irradiation is performed on the inside of a region that is to be a non-light-emitting portion through the laser irradiation at the time of repairing, and thus the surface area of the light-emitting region is not reduced by the laser irradiation mark at the time of the preliminary irradiation.

Furthermore, the irradiation of the laser beam in the irradiating under a first irradiation condition and the irradiation of the laser beam in the irradiating under the second irradiation condition may be performed in a continuous manner using a same laser oscillator.

According to such a manufacturing method, there is no need to turn the laser ON and OFF in between the irradiating under a first irradiation condition and the irradiating under the second irradiation condition, and thus it is possible to maintain laser stability and perform more stable repair.

An organic electroluminescence (EL) device according to an aspect of the present invention includes: a light-emitting region including an anode, an organic light-emitting layer, and a cathode which are stacked in stated order; a shorted area between the anode and the cathode in the light-emitting region; a first laser irradiation mark formed in the light-emitting region; and a second laser irradiation mark formed in a form of a closed line surrounding the shorted area.

According to such a configuration, the condition for laser irradiation (secondary laser irradiation) at the time of repairing is determined by performing preliminary irradiation (primary laser irradiation) on the inside of a light-emitting region of a defective pixel, and thus there is no concern that characteristics of the laser irradiation targets are different as in the case where, for example, the preliminary irradiation is performed on the outside of the light-emitting region, and the condition for the laser irradiation at the time of repairing can be accurately determined, and thus it is possible to obtain an organic EL device in which repair is performed more reliably and stably.

Furthermore, the first laser irradiation mark may be formed inside a region surrounded by the second laser irradiation mark.

According to such a configuration, the preliminary irradiation is performed on the inside of a region that is to be a non-light-emitting portion through the laser irradiation at the time of repairing, the surface area of the light-emitting region is not reduced by the laser irradiation mark at the time of the preliminary irradiation.

Furthermore, the first laser irradiation mark and the second laser irradiation mark may be formed in a continuous manner.

According to such a configuration, there is no need to turn the laser ON and OFF in between the irradiating under a first irradiation condition and the irradiating under the second irradiation condition, and thus it is possible to obtain an organic EL device in which laser stability is maintained and repair is performed more stably.

Furthermore, a resistance value of a portion of the light-emitting region in which the second laser irradiation mark is formed may be higher than a resistance value of a portion of the light-emitting region in which neither one of the first laser irradiation mark and the second laser irradiation mark is formed.

According to such a configuration, electrically separating the shorted area from the light-emitting region using the second irradiation mark makes it possible to obtain an organic EL device in which the light-emitting capability of the light-emitting region is recovered.

Hereinafter, a method of manufacturing an organic EL device and an organic EL device manufacturing according to such a manufacturing method, according to an embodiment of the present invention shall be described with reference to the Drawings. Note that, in all the figures, the same reference numerals are given to the same or corresponding elements and redundant description thereof shall be omitted.

Embodiment 1

(Device Structure)

Figure 1:
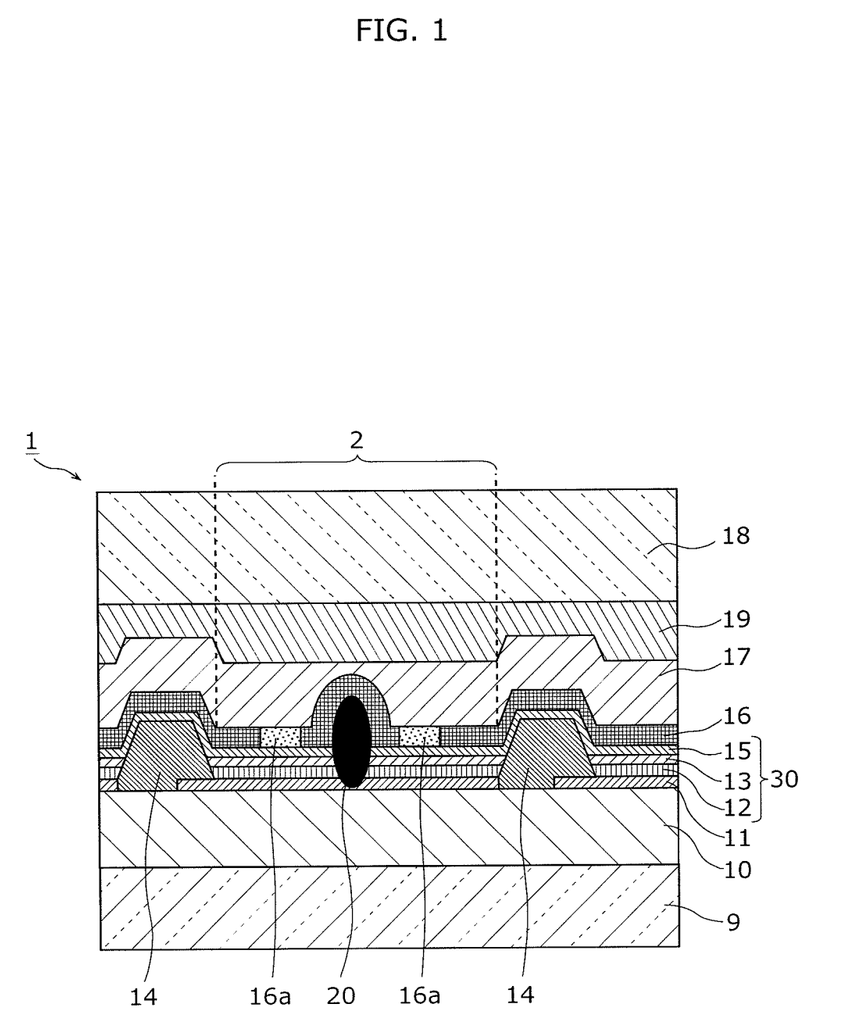
FIG. 1 is a schematic cross-sectional view of an organic EL device according to an embodiment of the present invention.

FIG. 1 is a schematic cross-sectional view of an organic EL device 1 according to Embodiment 1 of the present invention. The organic EL device 1 shown in FIG. 1 is an organic functional device including an anode, a cathode, and an organic layer interposed between both electrodes and including a light-emitting layer.

As shown in FIG. 1, the organic EL device 1 includes, on a transparent glass 9, a flattening film 10, an anode 11, a hole injection layer 12, a light-emitting layer 13, a bank 14, an electron injection layer 15, a cathode 16, a thin-film encapsulating layer 17, an encapsulating resin layer 19, and a transparent glass 18.

The anode 11 and the cathode 16 correspond, respectively, to a lower electrode layer and an upper electrode layer in the present invention. In addition, the hole injection layer 12, the light-emitting layer 13, and the electron injection layer 15 correspond to the organic layer in the present invention.

The transparent glass 9 and 18 are substrates that protect a light-emitting surface of a light-emitting panel and are, for example, transparent alkali-free glass having a thickness of 0.5 mm.

The flattening film 10 is made of, as an example, an insulating organic material, and is formed on, for example, a substrate including a thin-film transistor (TFT) for driving.

The anode 11 is an anode supplied with holes, that is, an anode into which a current flows from an external circuit, and has a configuration in which, for example, a reflective electrode comprising Al, a silver alloy APC, or the like is stacked on the flattening film 10. The reflective electrode has, for example, a thickness of 10 nm to 40 nm. Note that the anode 11 may have a two-layer structure comprising, for example, indium tin oxide (ITO) and silver alloy APC. Thus, by forming the anode 11 with a metal having high reflectivity such as APC, the emitted laser beam is reflected by the metal having such highly reflectivity, so that the laser beam can be collected more efficiently to the layer onto which focusing is intended.

The hole injection layer 12 is a layer mainly comprising a hole-injecting material. The hole-injecting material is a material having a function to stably inject the holes injected from an anode 11 side into the light-emitting layer 13 or to support the generation of holes and inject the generated holes into the light-emitting layer 13; for example, a compound such as polyethylenedioxythiophene (PEDOT), aniline, and so on, is used for the material.

The light-emitting layer 13 is a layer which emits light when a voltage is applied between the anode 11 and the cathode 16, and has a structure in which, for example, α-NPD (Bis[N-(1-naphthyl)-N-phenyl]benzidine) as the lower layer and Alq3 (tris-(8-hydroxyquinoline)aluminum) as the upper layer are stacked.

The hole injection layer 15 is a layer mainly comprising an electron-injecting material. The electron-injecting material is a material having a function to stably inject electrons injected from the cathode 16 into the light-emitting layer 13 or to support generation of electrons to inject the generated electrons into the light-emitting layer 13; for example, polyphenylene vinylene (PPV) is used for the material.

The cathode 16 is a cathode supplied with electrons, that is, a cathode from which a current flows toward an external circuit, and is formed into a stacked structure using, for example, a transparent metal oxide ITO. The cathode 16 can also be formed as a more transparent electrode using a material such as Mg and Ag. In addition, the electrode has, for example, a thickness of 10 nm to 40 nm.

The bank 14 is a wall for separating the light-emitting layer 13 into light-emitting regions 2 which can emit-light and be driven independently, and comprises, for example, a photosensitive resin.

The thin-film encapsulating layer 17 comprises, for example, silicon nitride, and has a function to shield the light-emitting layer 13 and the cathode 16 from vapor and oxygen. This is intended to prevent the light-emitting layer 13 itself or the cathode 16 from deteriorating (oxidizing) due to exposure to vapor and oxygen.

The encapsulating resin layer 19 comprises an acrylic resin or epoxy resin, and has a function to junction a layer that is integrally formed on the substrate from the flattening film 10 to the thin-film encapsulating layer 17, and the transparent glass 18.

The stacked structure including the anode 11, the light-emitting layer 13, and the cathode 16 as described above is a basic configuration of the organic EL device 1, and according to such a configuration, when an appropriate voltage is applied between the anode 11 and the cathode 16, holes and electrons are injected into the light-emitting layer 13 from the anode 11 side and the cathode 16 side, respectively. These injected holes and electrons are reunited in the light-emitting layer 13 to produce energy, which excites a light-emitting material in the light-emitting layer 13 to emit light.

Note that in the present invention, the material of the hole injection layer 12 and the electron injection layer 15 is not limited, and a known organic or inorganic material are used.

In addition, as a configuration of the organic EL device 1, a hole transport layer may be formed between the hole injection layer 12 and the light-emitting layer 13, and an electron transport layer may be formed between the electron injection layer 15 and the light-emitting layer 13. In addition, the hole transport layer may be provided in place of the hole injection layer 12, and the electron transport layer may be provided in place of the electron injection layer 15. The hole transport layer is a layer having a hole-transporting material as a main component. Here, the hole-transporting material is a material having both electron-donating properties that are more likely to generate positive ions (holes) and properties that transport the generated holes by intermolecular charge transfer reaction, and is a material appropriate for charge transport from the anode 11 to the light-emitting layer 13. Furthermore, the electron transport layer is a layer having an electron-injecting material as a main component. Here, the electron-transporting material is a material having both electron-accepting properties that are more likely to generate negative ions and properties that transport the generated electrons by intermolecular charge transfer reaction, and is a material appropriate for charge transport from the cathode 16 to the light-emitting layer 13.

In addition, the organic EL device 1 may further have a configuration in which color filters (light control layer) which adjust colors of red, green, and blue are provided in an undersurface of the transparent glass 18, to cover the respective light-emitting regions separated by the banks 14.

Note that in the present invention, the hole injection layer 12, the light-emitting layer 13, and the electron injection layer 15 are integrally referred to as an organic layer 30. In addition, in the case of including the hole transport layer and the electron transport layer, these layers are also included in the organic layer 30. The organic layer 30 has, for example, a thickness of 100 nm to 200 nm.

In addition, the flattening film 10, the anode 11, the organic layer 30, the cathode 16, the thin-film encapsulating layer 17, the encapsulating resin layer 19, and the transparent glass 18 that are provided in a single light-emitting region 2 which is bounded by the banks 14 and allows independent light-emission control, make up a single organic EL device 1.

An organic EL panel (image display panel) can be configured by arranging plural organic EL devices 1 in a matrix and providing drive circuits for driving the light-emission of the respective organic EL devices 1. In this Description, a part including a single organic EL device 1 and a corresponding drive circuit in such an organic EL panel is referred to as a pixel.

Furthermore, in the organic EL device 1 shown in FIG. 1, a conductive foreign substance 20 is mixed in between the anode 11 and the cathode 16 in the manufacturing process, and a short circuit occurs between the anode 11 and the cathode 16 via the foreign substance 20. The shorted area caused by the foreign substance 20 is an example of a defective portion of the light-emitting region 2.

In addition, an irradiation mark 16a caused by irradiation of a laser beam is formed in a portion of the cathode located around the foreign substance 20 to resolve (repair) the defect caused by the short circuit caused between the anode 11 and the cathode 16 by the foreign substance 20. Details of the repair using laser beam irradiation shall be described later.

Figure 2:
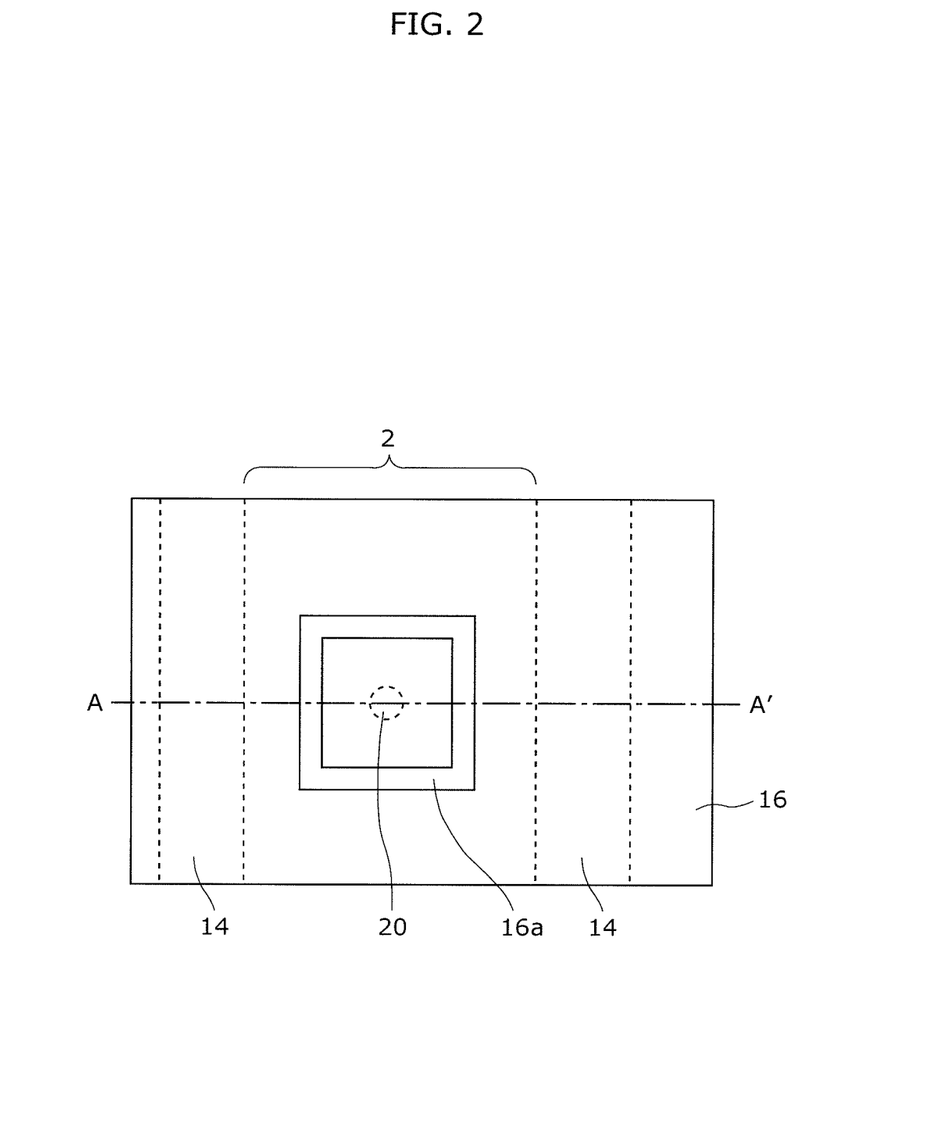
FIG. 2 is a top view of the organic EL device showing the state of a cathode with increased resistance.

FIG. 2 is a top view of the organic EL device 1, and shows a typical example of the planar position of the irradiation mark 16a formed by the irradiation of a laser beam, in the light-emitting region 2 having the shorted area caused by the foreign substance 20. Here, the AA' cross-section shown in FIG. 2 corresponds to FIG. 1.

The laser beam is emitted tracing a closed line surrounding the shorted area in the cathode 16 caused by the foreign substance 20. A 20 μm×20 μm square contour line in the cathode 16 which is defined by a perimeter that is approximately 10 μm away from the foreign substance 20 may be irradiated with the laser beam. As a result, the irradiation mark 16a in a form such as that shown in FIG. 2 is formed in the cathode 16. The resistance value of the irradiation mark 16a is higher than the original resistance value of the cathode 16 which has not been irradiated with the laser beam.

In the subsequent description, using laser beam irradiation to increase the resistance value of the irradiation target area compared to that before the laser beam irradiation is called resistance-increasing.

(Manufacturing Method)

Next, a method of manufacturing the organic EL device 1 shall be described. This manufacturing method includes a process of resolving a defect caused by a defective portion of the organic EL device 1.

Figure 3:
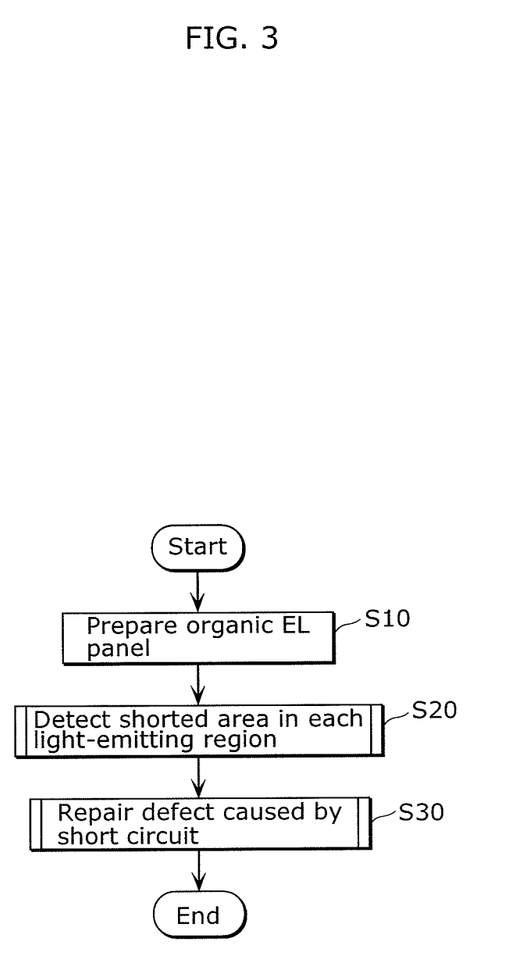
FIG. 3 is a flowchart for describing a method of manufacturing the organic EL device according to the present invention.

FIG. 3 is a flowchart for describing a method of manufacturing the organic EL device 1 according to the present invention.

First, an organic EL panel is prepared (S10). The organic EL panel comprises pixels arranged in a matrix, in each of which an organic EL device 1 and a drive circuit for driving the organic EL device 1 are formed. This process includes a process of forming, by stacking, the organic EL devices 1 included in the pixels arranged in the matrix.

Next, in the organic EL panel prepared in step S10, the light-emitting region in each pixel is checked and, in each of the light-emitting regions, a shorted area where the anode 11 and cathode 16 are short-circuited is detected as a defective portion (S20).

Lastly, a defect caused by the defective portion detected in step S20 is repaired by laser irradiation (S30). The process in step S30 is a characteristic process of the present invention.

Hereinafter, the respective processes described above shall be described in detail.

First, the process of preparing the organic EL panel (S10) is described.

Figure 4:
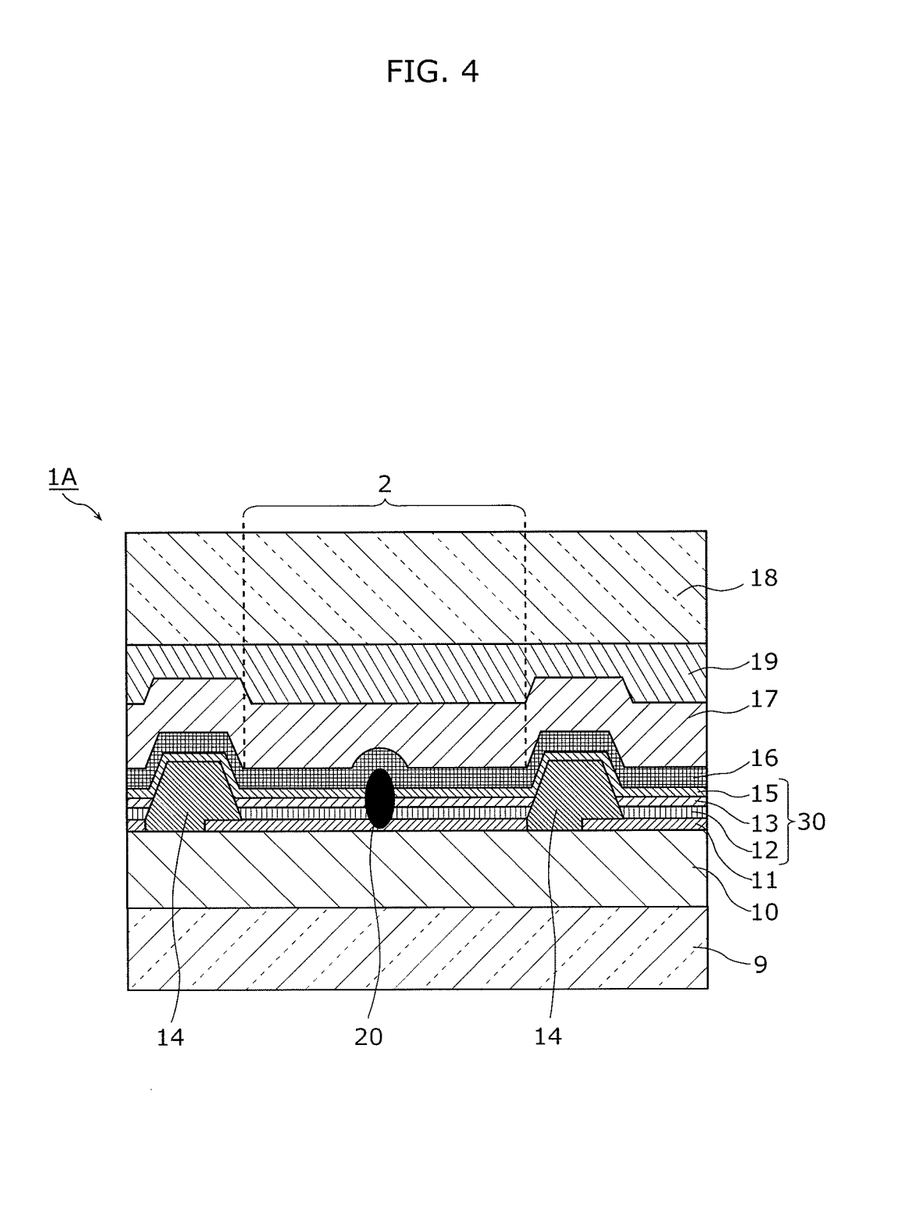
FIG. 4 is a schematic cross-sectional view of the organic EL device to be prepared in a first process in the present invention.

FIG. 4 is a partial schematic cross-sectional view of the organic EL panel prepared in a first process according to the present invention. FIG. 4 shows a cross-sectional structure of an organic EL device 1A in which a short circuit is caused between the anode 11 and the cathode 16 by the foreign substance 20.

First, the flattening film 10 comprising an insulating organic material is formed on a substrate including a TFT, after which the anode 11 is formed on the flattening layer 10. The anode 11 is formed by, for example, forming a film of Al having a thickness of 30 nm on the flattening film 10 by the sputtering method and subsequently through a patterning process using photolithography and wet etching.

Next, the hole injection layer 12 is formed by, for example, preparing a PEDOT solution by dissolving PEDOT into a solution including xylene and spin-coating the anode 11 with the solution.

Next, the light-emitting layer 13 is formed by, for example, stacking α-NPD and Alq3 on the hole injection layer 12 by the vacuum deposition method.

Next, the electron injection layer 15 is formed by, for example, preparing a solution by dissolving polyphenylene vinylene (PPV) into a solution including xylene or chloroform and spin-coating the light-emitting layer 13 with the solution.

Subsequently, the cathode 16 is formed without exposing, to air, the substrate on which the electron injection layer 15 is formed. Specifically, the cathode 16 is formed by stacking an indium tin oxide (ITO) layer of 35 nm on the electron injection layer 15 by the sputtering method. At this time, the cathode 16 is in an amorphous state.

According to the manufacturing process described above, an organic EL device having a function as a light-emitting element is formed. Note that between the process of forming the anode 11 and the process of forming the hole injection layer 12, the bank 14 comprising a photosensitive resin is formed at predetermined positions.

Next, the thin-film encapsulating layer 17 is formed by, for example, stacking a silicon nitride layer of 500 nm on the cathode 16 by the plasma chemical vapor deposition (CVD) method. Since the thin-film encapsulating layer 17 is formed in contact with the surface of the cathode 16, a strict requirement for the protection film may be provided, and a non-oxygenated inorganic material represented by silicon nitride as described above may be used. In addition, for example, the thin-film encapsulating layer 17 may be formed of an oxygenated inorganic material such as a silicon oxide ($Si_xO_y$) or a silicon oxynitride ($Si_xO_yN_z$), or may be formed of plural layers using these inorganic materials. In addition, the forming method is not limited to the plasma CVD method, and may be another method such as a sputtering method using argon plasma.

Next, the encapsulating resin layer 19 is applied to a surface of the thin-film encapsulating layer 17. Subsequently, the transparent glass 18 is disposed on the encapsulating resin layer 19 that is applied. Here, color filters (light control layer) may be formed in advance in a main surface of the transparent glass 18. In this case, the transparent glass 18 is disposed on the applied encapsulating resin layer 19, with the surface in which the color filters are formed being oriented downward. Note that the thin-film encapsulating layer 17, the encapsulating resin layer 19, and the transparent glass 18 function as a protection layer.

Lastly, the encapsulating resin layer 19 is hardened by applying a heat or energy ray and concurrently pressing down the transparent glass 18 from the upper side, so as to bond the transparent glass 18 and the thin-film encapsulating layer 17.

According to the forming method as described above, the organic EL device 1A shown in FIG. 4 is formed.

Note that the processes of forming the anode 11, the hole injection layer 12, the light-emitting layer 13, the electron injection layer 15, and the anode 16 are not limited by the present invention.

Furthermore, the light-emitting region 2 of the organic EL device 1A has a defective portion, that is, a shorted area between the anode 11 and the cathode 16 caused by the foreign substance 20 mixed in during the above-described manufacturing process, and a defect caused by the short circuit occurs in the organic EL device 1A.

Next, a process of identifying the defective portion in the organic EL device (S20) shall be described.

In FIG. 4, the foreign substance 20 is generated when, for example, Al that is a material for the anode 11 is attached on the anode 11 after the anode 11 is formed, and subsequently the hole injection layer 12, the light-emitting layer 13, the electron injection layer 15, and the cathode 16 are stacked on the anode 11. The size of the foreign substance 20 is, for example, approximately 200 nm in diameter and 500 nm in height. When there is a shorted area caused between the anode 11 and the cathode 16 by the foreign substance 20, the current that is normally for driving light emission flows to the shorted area, and thus the light-emitting region 2 is unable to emit light sufficiently or is completely unable to emit light. A pixel corresponding to the light-emitting region that has lost its normal light-emitting ability in the manner described above shall be referred to hereinafter as a dark-spot pixel.

Figure 5:
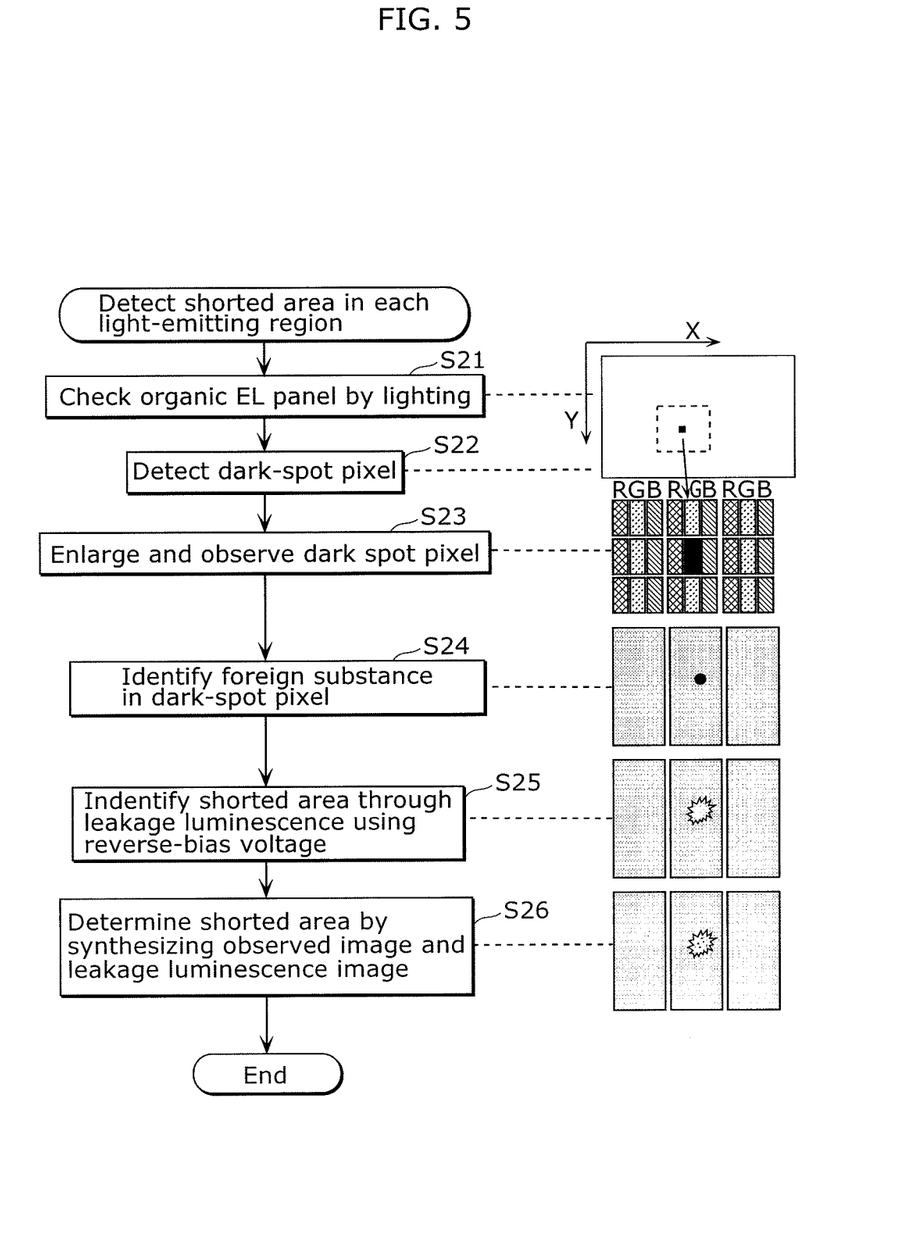
FIG. 5 is an operational flowchart for describing step S20 according to the embodiment of the present invention.

FIG. 5 is an operational flowchart for describing step S20 according to the embodiment of the present invention.

First, lighting check is performed on the organic EL panel formed in step S10 (S21). Specifically, a forward-bias voltage is applied at a time to all the pixels included in the organic EL panel, using a drive circuit included in the organic EL panel or a source meter that is externally connected. At this time, imaging of all the pixels is performed simultaneously using a CCD camera and so on.

Then, the light-emitting brightness of each pixel is calculated from the image taken during the period in which the forward-bias is applied, so as to detect, as a dark-spot pixel, a pixel having a light-emitting brightness lower than a predetermined threshold (S22).

Next, the detected dark-spot pixel is enlarged and observed (S23). Specifically, for example, the dark-spot pixel is observed using a microscope camera.

At this time, the foreign substance 20 is identified in the region of the dark-spot pixel enlarged and observed (S24).

Next, a reverse-bias voltage is applied to the dark-spot pixel detected in step S22, so as to identify a light-emitting point producing leakage luminescence (S25). In the normal pixel, current does not flow in the organic EL device due to the reverse-bias voltage, but in the light-emitting region having the shorted area, leakage luminescence caused by current leakage can be observed at the shorted area. The leakage luminescence point in the light-emitting region is identified using the image obtained by capturing this state of leakage luminescence.

Specifically, using the drive circuit included in the organic EL panel or a source meter that is externally connected, a predetermined reverse-bias voltage is applied to the pixel to be checked. Then, the point producing leakage luminescence higher than a threshold during the period in which the reverse-bias voltage is applied is identified. Note that since the leakage luminescence caused by the application of the reverse-bias voltage is weak, the imaging using the CCD camera and so on may be performed in an environment where light is completely blocked out. Then the presence of leakage luminescence is determined by comparing light emission intensity at each imaging point with a predetermined threshold. Thus, the leakage luminescence point is identified.

Note that the CCD camera may be a cooled CCD camera. This ensures a predetermined S/N ratio even in the imaging of a weak leakage luminescence of the organic EL device. This accordingly eliminates noise during the checking, and thus leakage luminescence point detection accuracy increases.

Next, the image of the dark-spot pixel enlarged and observed in step S24 through application of the forward-bias voltage and an image of the leakage luminescence point observed through application of the reverse-bias voltage in step S25 are synthesized, to thereby determine the position of the shorted area in the dark-spot pixel (S26).

Note that in the process of determining the position of the shorted area in step S26 described above, the position of the shorted area may be determined through the matching of the position of the foreign substance identified in step S24 and the position of the leakage luminescence point identified in step S25, or the position of the shorted area may be determined using only the position of the foreign substance or the position of the leakage luminescence point.

In addition, the detection of a light-emitting region including the shorted area is not limited to the method described above, and may be performed based on a magnitude of a current value obtained by measuring a value of the current flowing between the anode 11 and the cathode 16 in the organic EL device. In this case, a pixel may be determined to be a dark-spot pixel if a current value equivalent to that of a normal pixel can be obtained in the pixel when forward-bias voltage is applied, and leakage luminescence is observed in the pixel when reverse-bias voltage is applied.

Next, a process of repairing the defect caused by the shorted area in the organic EL device by laser irradiation (S30), which is a main part of the present invention, shall be described.

In this process, first, the light-emitting region in which the position of the shorted area is identified is irradiated with a laser beam under a first irradiation condition, and the appearance of the irradiation mark created in the light-emitting region as a result of the irradiation is observed. This irradiation mark is for verifying the appropriateness of the first irradiation condition, and is formed in an area that does not contribute to the resolving of a light emission defect.

Subsequently, a second irradiation condition is determined based on the first irradiation condition and the observed appearance of the irradiation mark, and the light-emitting region is irradiated with a laser beam under the determined second irradiation condition, to resolve the defect caused by the defective portion.

Figure 6:
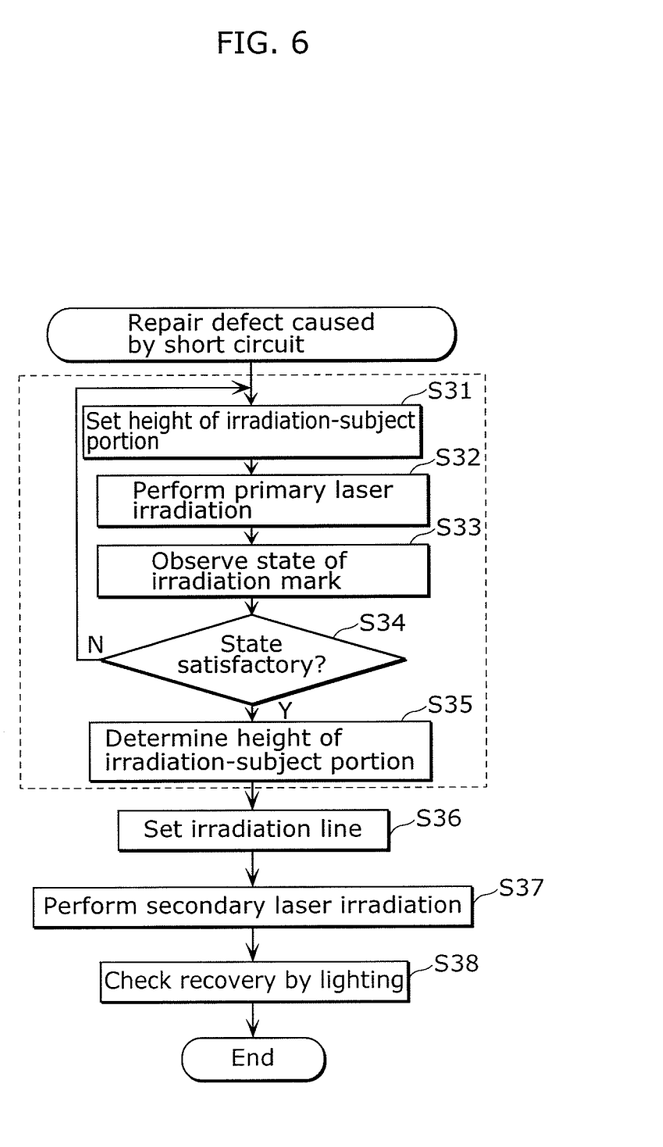
FIG. 6 is an operational flowchart for describing step S30 according to the embodiment of the present invention.
Figure 7:
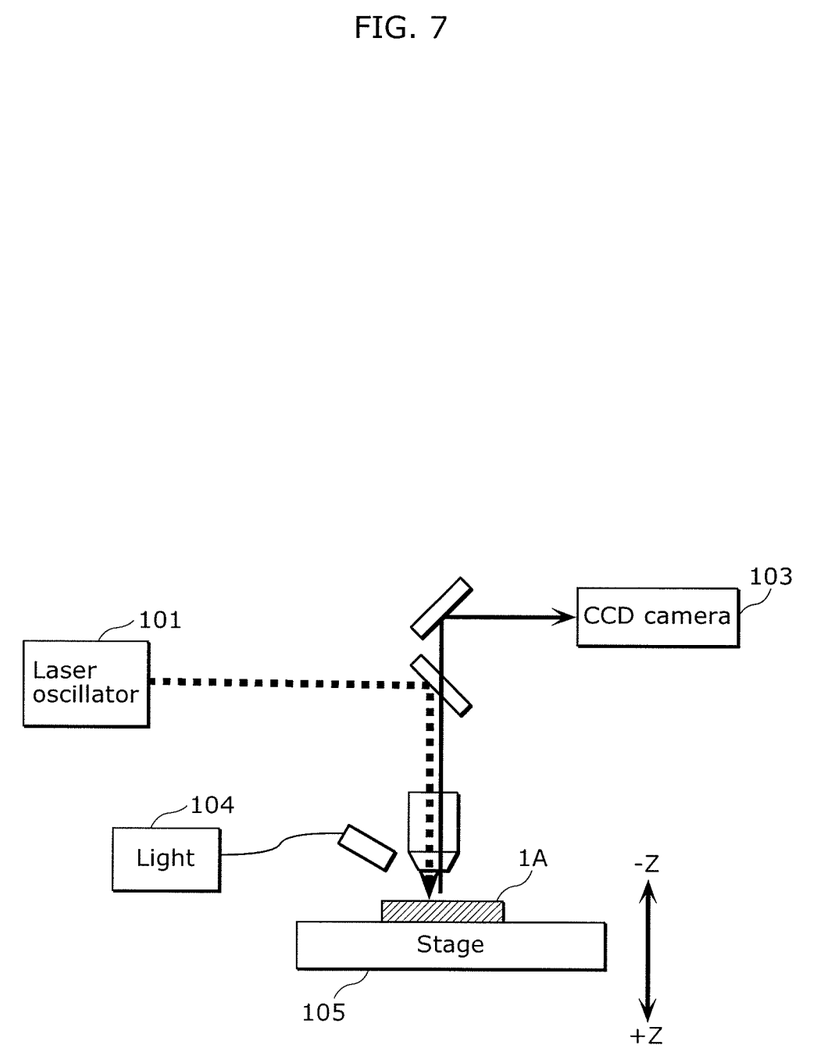
FIG. 7 is a system configuration diagram for performing laser repair according to the embodiment of the present invention.

FIG. 6 is an operational flowchart for describing step S30 according to the embodiment of the present invention. In addition, FIG. 7 is a system configuration diagram for performing laser repair according to the embodiment of the present invention. The system shown in FIG. 7 includes: a laser oscillator 101; a CCD camera 103; a light 104; and a stage 105. In addition, the organic EL panel including the organic EL device, which is in the process of being manufactured, is set in place on the stage 105.

The laser oscillator 101 is capable of oscillating an ultrashort-pulse laser having, for example, a wavelength of 750 nm to 1600 nm, output energy of 1 µJ to 30 µJ, and a pulse width in the order of several femtoseconds to the order of several picoseconds. Such ultrashort-pulse laser includes, for example, a femtosecond laser, and a preferred pulse width is 100 fs to 20 ps. By irradiation with such ultrashort-pulse laser, it is possible, in particular, to readily increase the resistance of the constituent material of the anode or cathode that is in an amorphous state. Furthermore, it is possible to increase resistance of a transparent conductive material that cannot be readily processed using another type of laser.

In the embodiment, the laser is focused on the cathode 16 so as to increase the resistance of a part of the cathode 16. At this time, the range of output energy that allows increasing the resistance of the part of the cathode 16 depends on the wavelength of the laser to be emitted. When the cathode 16 is irradiated with a laser having excessive output energy, the laser reaches the organic layer 30 provided under the cathode 16, and the organic layer 30 is damaged. In addition, when the cathode 16 is irradiated with a laser having very low output energy, the resistance of the cathode 16 is not increased. In addition, when irradiated with a laser having a pulse width of 20 psec or more, the organic layer 30 will be damaged. Considering all of these, it is possible to readily increase resistance of a part of the cathode 16 by irradiating the organic EL device with a laser having a wavelength within the range of the laser wavelength described above and having a pulse width within the range of the pulse width described above.

The CCD camera 103 captures an image of the organic EL panel on the stage 105.

The light 104 emits an auxiliary light required for capturing an image of the organic EL panel.

The stage 105 is capable of moving in a height direction Z as well as in plane directions X and Y while carrying the organic EL panel, and determines the position of the laser irradiation area of an organic EL device.

The repair process (S30) shall be described in detail below according to the flowchart in FIG. 6.

First, the height of the laser irradiation area (irradiation-target portion) of the organic EL device is set (S31). Specifically, a Z-position of the stage 105 is set to a position at which the focus of the laser beam matches, for example, the cathode 16 of the organic EL device 1A.

Next, at the Z-position thus set, the organic EL panel is irradiated with a laser beam having the same pulse width, wavelength, and power as the pulse width, wavelength, and power of a laser beam to be subsequently emitted for repairing (S32).

Step S32 described above corresponds to irradiating a light-emitting region of the organic EL device 1A which includes a defective portion with a laser beam under a first irradiation condition. Here, the Z-position of the stage 105 (that is, the focal depth of the laser beam), the pulse width, wavelength, and power of the laser beam during the irradiation with the laser beam in step S32 are examples of the first irradiation condition.

Next, the state of the irradiation mark formed in the light-emitting region through the irradiation with the laser beam is observed (S33). For example, the state of the irradiation mark may be recognized automatically from an image of the irradiation mark captured by the CCD camera 105 through the thin-film encapsulating layer 17, the transparent glass 18, and the encapsulating resin layer 19. Since visible light passes through all of the thin-film encapsulating layer 17, the transparent glass 18, and the encapsulating resin layer 19, the image-capturing of the irradiation mark can be performed using visible light.

Step S33 described above corresponds to observing a state of an irradiation mark formed in the light-emitting region through the irradiation with the laser beam in the irradiating under a first irradiation condition.

When the observed state of the irradiation mark is satisfactory (Y in S34), the first irradiation condition that was set at that time is determined as the second irradiation condition to be used in the laser irradiation for repairing (S35). Here, whether or not the state of the irradiation mark is satisfactory may be determined, for example, by whether or not the diameter of the irradiation mark is of a desired size or greater, or whether or not the degree of shading of color of the irradiation mark is a predetermined value or greater. The degree of shading of the color of the irradiation mark can also be determined by taking an image using an image-capturing device and quantifying the image. When an irradiation mark of the desired size or color is obtained, it is considered to be because the Z-position of the stage 105 is appropriate and the laser beam is satisfactorily focused on the irradiation-target portion of the organic EL device.

On the other hand, when an irradiation mark of the desired size is not obtained (N in S34), the process returns to step S31, the Z-position of the stage 105 is re-set, and the primary laser irradiation (S32) and the irradiation mark state observation (S33) are performed again under the re-set irradiation condition. The optimal Z-position of the stage 105 is derived by repeating such processes.

Note that steps S31 to S34 can also be repeated without stopping the laser beam emission. In this case, the Z-position of the stage 105 is successively changed from the initial Z-position (S31), and the laser beam is continuously emitted while changing the plane position (S32). By doing so, a linear irradiation mark of gradually increasing width can be obtained, and thus the irradiation mark is observed from point to point (S33), and the state of the irradiation mark is determined to be satisfactory when a predetermined line width is reached (Y in S34). Then, the first irradiation condition that is set at such time is determined as the second irradiation condition to be used in the laser irradiation for repairing (S35).

Step S35 describe above corresponds to determining a second irradiation condition for resolving a defect caused by the defective portion, based on the first irradiation condition and the observed state of the irradiation mark.

Note that, the criteria for determining that the state of the irradiation mark is satisfactory in step S34 is not limited to the diameter or line width of the irradiation mark and the degree of shading of the color of the irradiation mark, and the smoothness of the contour of the irradiation mark may be taken into consideration. Furthermore, the irradiation condition that is re-set according to the appearance of the irradiation mark in the second iteration of step S31 onward is not limited to the Z-position of the stage 105 (that is, the laser beam focal depth), and may be any one or more of the pulse width, the wavelength, and power of the laser beam.

For example, since it is known from experience that the contour of the irradiation mark becomes rough (does not become smooth) when the output energy of the laser beam is too great, it is sufficient that, when roughness in the contour of the irradiation mark is recognized, the power of the laser beam is reduced and the first laser irradiation and irradiation mark state observation is performed again.

Next, setting of an irradiation line of the laser beam is performed (S36). Specifically, as described in FIG. 2, an irradiation line in the plane direction traced by the laser beam on the closed line surrounding the shorted area in the cathode 16 caused by the foreign substance 20 (for example, on the 20 μm×20 μm square contour line in the cathode 16 defined by a perimeter that is approximately 10 μm away from the foreign substance) is set.

Next, the laser beam is emitted at the height of the stage 105 determined in step S35 and in such a way as to trace the irradiation line set in step S36 (S37).

Step S37 describe above corresponds to irradiating the light-emitting region with a laser beam under the second irradiation condition determined in the determining of a second irradiation condition.

Figure 8:
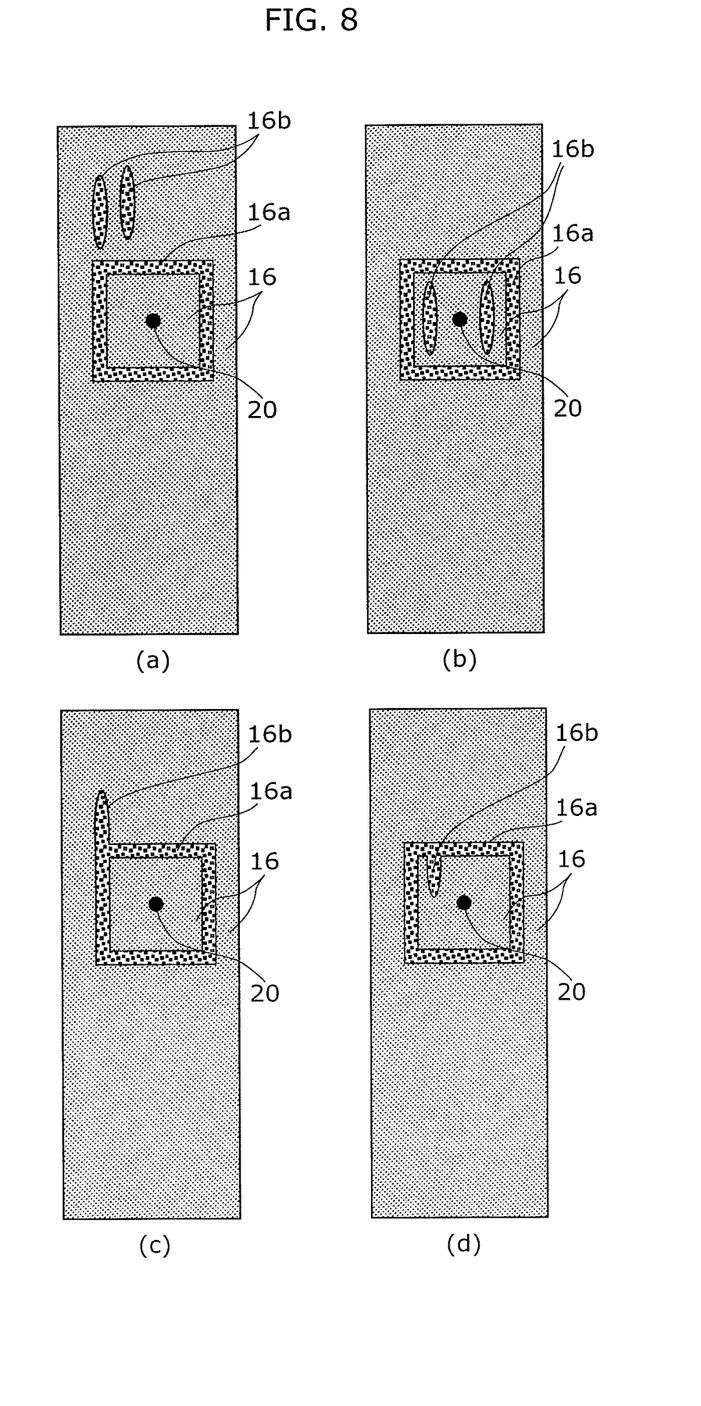
FIGS. 8(a) to 8(d) show top views of the organic EL device showing the state of an irradiation mark formed by laser irradiation.

FIG. 8 (a) to (d) show examples of an irradiation mark formed in a part of the cathode 16 in the light-emitting portion through the above-described process. In FIG. 8 (a) to (d), an irradiation mark 16b is formed through the primary laser irradiation which is the laser irradiation in step S32, and an irradiation mark 16a is formed through the secondary laser irradiation which is the laser radiation in step S37.

FIG. 8 (a) and FIG. 8 (c) show an example in which the primary laser irradiation is performed outside a region surrounded by the irradiation line of the secondary laser irradiation. Furthermore, FIG. 8 (b) and FIG. 8 (d) show an example in which the primary laser irradiation is performed inside a region surrounded by the irradiation line of the secondary laser irradiation.

In all of the above cases, the primary laser irradiation and the secondary laser irradiation are performed inside the same light-emitting region and on irradiation targets having the same characteristics, and thus there is no concern about the suitable irradiation condition for the laser beams being different between the primary laser irradiation and the secondary laser irradiation due to a difference in the characteristics of the irradiation targets. Therefore, by observing the state of the irradiation mark formed through the primary laser irradiation, the suitable irradiation condition that should be applied for the secondary laser irradiation can be determined with a sufficiently accurate and reliable degree of precision. As a result, the repair process can be performed more reliably and stably.

In particular, when the primary laser irradiation is performed within the region surrounded by the irradiation line of the secondary laser irradiation as in FIG. 8 (b) and FIG. 8 (d), the above-described advantageous result can be obtained without damaging regions whose light-emitting capability are to be recovered after repair.

Furthermore, in FIG. 8 (c) and FIG. 8 (d), the irradiation mark 16b and the irradiation mark 16a are formed in a continuous manner, and such irradiation marks 16b and 16a are formed, for example, by performing the primary laser irradiation and secondary laser irradiation in a continuous manner using the same laser oscillator. In this case, since there is no need to stop the laser oscillation between the primary laser irradiation and the secondary laser irradiation, stability of laser output can be maintained. As a result, the repair process can be performed more reliably and stably.

Lastly, it is checked by lighting whether or not the light-emission capability of the dark-spot pixel is recovered through the laser irradiation described above (S38).

Figure 9:
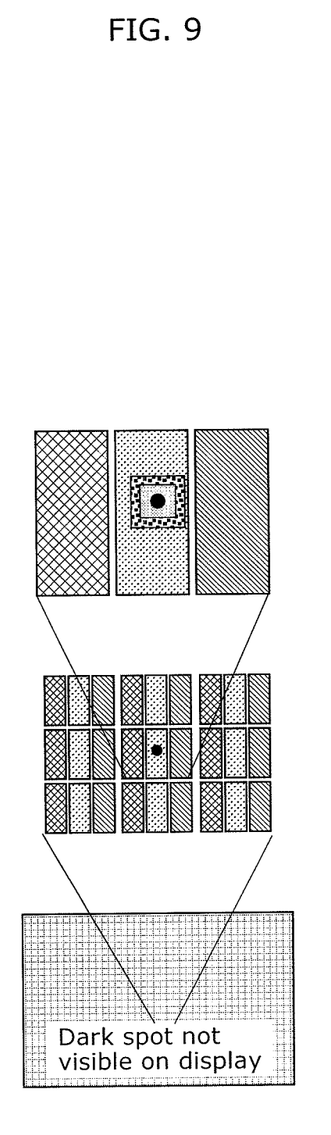
FIG. 9 is a diagram showing a light-emitting state of a pixel at the time of recovery check by lighting.

FIG. 9 is a diagram showing a light-emitting state of a pixel at the time of recovery check by lighting. In the secondary laser irradiation in step S37, even when forward-bias voltage is applied, the dark-spot pixel does not emit light until the tracing of the irradiation line by the laser beam is completed such that the irradiation mark is in the form of the closed line.

Subsequently, when the irradiation line tracing is completed, the forward-bias voltage is applied to see that, although the region surrounded by the irradiation mark does not emit light, the other regions emit light. When this is checked across the entire organic EL light-emitting panel, even when the region in the shape of the 20 μm×20 μm square does not emit light, such non light-emitting portion is not visually recognizable, so that the light-emitting defect caused by the short circuit is resolved.

Note that the present invention is not limited to the above-described embodiment and modifications thereof, and various modifications to this embodiment that can be conceived by those skilled in the art, and forms configured by combining constituent elements in different embodiments and modifications thereof without departing from the teachings of the present invention are included in the scope of the present invention.

For example, although the embodiment described above shows a configuration in which the lower electrode is the anode and the upper electrode is the cathode, the configuration may also be such that the lower electrode is the cathode and the upper electrode is the anode. In addition, the constituent elements of the organic EL device, such as the flattening film, the anode, the hole injection layer, the light-emitting layer, the bank, the electron injection layer, the cathode, the thin-film encapsulating layer, the encapsulating resin layer, and the transparent glass are not limited to those in this embodiment described above but may be changed in material, composition, and forming method. For example, a hole transport layer may be provided between the hole injection layer and the light-emitting layer, and an electron transport layer may be provided between the electron injection layer and the light-emitting layer. In addition, color filters which adjust colors of red, green, and blue may be provided in the undersurface of the transparent glass, to cover the respective light-emitting regions separated by the banks. Since the femtosecond laser described above can pass through the color filter, it is possible to resolve the short circuit through the color filter.

In addition, the laser irradiation position is not limited to the embodiment described above but may be set to a predetermined range including the foreign substance or the shorted area, or may be set only to the foreign substance or the shorted area. In addition, the position may be set to surround the surrounding area of the foreign substance or the shorted area. In addition, the laser irradiation may be performed not only on the cathode but also on the anode.

Figure 10:
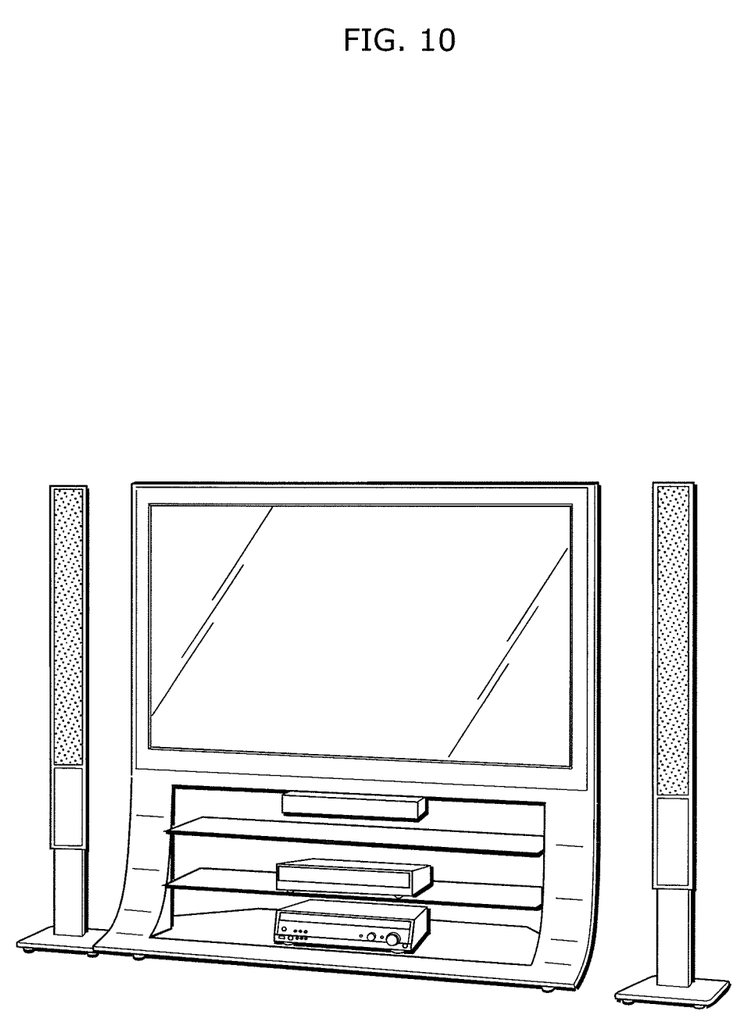
FIG. 10 is an external view of a television system including the organic EL device in the present invention.

Furthermore, the present invention is suitable for the manufacturing of a thin-screen television system including an organic EL device, as shown in FIG. 10.

INDUSTRIAL APPLICABILITY

An organic EL device and a method of manufacturing an organic EL device according to the present invention are useful, in particular, in a technical field such as a thin-screen television or a personal computer display that requires a larger screen and higher resolution.

REFERENCE SIGNS LIST 1, 1A Organic EL device
2 Light-emitting region
9 Transparent glass
10 Flattening film
11 Anode
12 Hole injection layer
13 Light-emitting layer
14 Bank
15 Electron injection layer
16 Anode
16a, 16b Irradiation mark
17 Thin-film encapsulating layer
18 Transparent glass
19 Encapsulating resin layer
20 Foreign substance
30 Organic layer
101 Laser oscillator
103 CCD camera
104 Light
105 Stage

The invention claimed is:

1. A method of manufacturing an organic electroluminescence (EL) device, the method comprising:
    irradiating a light-emitting region of the organic EL device with a laser beam under a first irradiation condition, the light-emitting region including a defective portion;
    capturing an image of a state of an irradiation mark provided in the light-emitting region through the irradiation with the laser beam under the first irradiation condition;
    determining a second irradiation condition for resolving a defect caused by the defective portion, based on the first irradiation condition and the captured state of the irradiation mark; and
    irradiating the light-emitting region with a laser beam under the second irradiation condition determined in the determining of the second irradiation condition
    wherein the defective portion is a shorted area between an anode and a cathode of the organic EL device,
    in the irradiating under the second irradiation condition, the laser beam is emitted in a form of a closed line surrounding the shorted area of the light-emitting region so that a resistance value of a portion located on the closed line form is higher than a resistance value of the portion before the irradiation with the laser beam, and
    in the irradiating under the first irradiation condition, the laser beam is emitted to an inside of a region that is to be surrounded by the closed line.

2. The method of manufacturing an organic EL device according to claim 1,
    wherein the irradiation of the laser beam in the irradiating under the first irradiation condition and the irradiation of the laser beam in the irradiating under the second irradiation condition are performed in a continuous manner using a same laser oscillator.

3. The method of manufacturing an organic EL device according to claim 1,
    wherein in the determining of the second irradiation condition, at least one of a focal point depth, pulse width, wavelength, and power of the laser beam is determined as the second irradiation condition.

4. An organic electroluminescence (EL) device comprising:
    a light-emitting region including an anode, an organic light-emitting layer, and a cathode which are stacked in stated order;
    a shorted area between the anode and the cathode in the light-emitting region;
    a first laser irradiation mark provided in the light-emitting region; and
    a second laser irradiation mark provided in a form of a closed line surrounding the shorted area
    wherein the first laser irradiation mark is provided inside a region surrounded by the second laser irradiation mark.

5. The organic EL device according to claim 4,
    wherein the first laser irradiation mark and the second laser irradiation mark are provided in a continuous manner.

6. The organic EL device according to claim 4,
    wherein a resistance value of a portion of the light-emitting region in which the second laser irradiation mark is provided is higher than a resistance value of a portion of the light-emitting region in which neither one of the first laser irradiation mark and the second laser irradiation mark is provided.

7. The method according to claim 1, wherein the irradiating under the first irradiation condition comprises repeating the irradiating under the first irradiation condition and changing a plane position of the irradiation,
    the capturing comprises capturing a width of the irradiation mark as the state of the irradiation mark, and
    the determining sets the first irradiation condition as the second irradiation condition, when the captured width of the irradiation mark becomes a predetermined width.

* * * * *